United States Patent [19]
Kim et al.

[11] Patent Number: 6,001,696
[45] Date of Patent: Dec. 14, 1999

[54] TRENCH ISOLATION METHODS INCLUDING PLASMA CHEMICAL VAPOR DEPOSITION AND LIFT OFF

[75] Inventors: Chang-gyu Kim; Min-su Baek, both of Kyungki-do; Ji-hyun Choi, Seoul, all of Rep. of Korea

[73] Assignee: Samsung Electronics Co., Ltd., Rep. of Korea

[21] Appl. No.: 09/052,453

[22] Filed: Mar. 31, 1998

[30] Foreign Application Priority Data

May 27, 1997 [KR] Rep. of Korea ................ 97-20989

[51] Int. Cl.⁶ .................... H01L 21/76; H01L 21/336
[52] U.S. Cl. ................... 438/296; 438/404; 438/405; 438/424; 438/400
[58] Field of Search ............................ 438/424, 405, 438/404, 296

[56] References Cited

U.S. PATENT DOCUMENTS 4,599,136  7/1986  Araps et al. .
5,728,621  3/1998  Zheng et al. .
5,923,993  7/1999  Sahota .

FOREIGN PATENT DOCUMENTS 5-6935  1/1993  Japan .
6-29379  2/1994  Japan .

OTHER PUBLICATIONS

Notice of Office Action, Korean Applicatiion No. 97–20989, Jun. 28, 1999.

*Primary Examiner*—John F. Niebling
*Assistant Examiner*—Josetta Jones
*Attorney, Agent, or Firm*—Myers Bigel Sibley & Sajovec

[57] ABSTRACT

Isolation methods for integrated circuits use plasma chemical vapor deposition of an insulating layer followed by lift-off to remove at least portions of the insulating layer. In particular, a lift-off layer is formed on an integrated circuit substrate. The lift-off layer and the integrated circuit substrate beneath the lift-off layer are etched to form a trench in the integrated circuit substrate. The trench defines a first region on one side of the trench and a second region that is narrower than the first region on the other side of the trench. Plasma chemical vapor deposition is then performed to form an insulating layer filling the trench, on the first region and on the second region, with the insulating layer on the first region being thicker than on the second region. The insulating layer is then etched to expose the lift-off layer in the second region. The lift-off layer is then lifted off from the first region. Isolation trenches so formed can have improved isolation characteristics and can be planarized with reduced dishing effects.

16 Claims, 4 Drawing Sheets

TRENCH ISOLATION METHODS INCLUDING PLASMA CHEMICAL VAPOR DEPOSITION AND LIFT OFF

FIELD OF THE INVENTION

This invention relates to integrated circuit manufacturing methods, and more particularly to an isolation methods for integrated circuits.

BACKGROUND OF THE INVENTION

In fabricating integrated circuits, isolation regions are generally formed between active device regions to electrically isolate the regions from one another. One widely used isolation method is LOCal Oxidation of Silicon (LOCOS). Unfortunately, LOCOS isolation may create bird's beaks due to lateral oxidation, crystal defects in the integrated circuit substrates and/or redistribution of dopants that are ion implanted for channel stops. These and other disadvantages may make LOCOS isolation undesirable for high density integrated circuits.

Shallow Trench Isolation (STI) methods are also used to form isolation regions. In shallow trench isolation methods, an integrated circuit substrate is etched to form a trench and an insulating material is filled in the trench. Chemical-Mechanical Polishing (CMP) is then performed for form an insulation-filled trench. Since the shallow trench isolation method does not depend on a thermal oxidation process, at least some of the disadvantages of the LOCOS method can be avoided. Moreover, since narrow trenches may be formed in an integrated circuit substrate, high density integrated circuits may be formed.

Unfortunately, in shallow trench isolation methods, the insulating material is generally etched using chemical-mechanical polishing. The chemical-mechanical polishing may cause dishing in the middle of the trench, thereby recessing the trench surface. The recessed trench surface may degrade the isolation characteristics of the trench, and may also result in poor planarization of local regions.

SUMMARY OF THE INVENTION

It therefore an object of the present invention to provide improved isolation methods for integrated circuits.

It is another object of the present invention to provide trench isolation methods for integrated circuits that can reduce dishing of trench surfaces.

These and other objects are provided according to the present invention by isolation methods for integrated circuits that use plasma Chemical Vapor Deposition (CVD) of an insulating layer followed by lift-off to remove at least portions of the insulating layer. In particular, a lift-off layer is formed on an integrated circuit substrate. The lift-off layer and the integrated circuit substrate beneath the lift-off layer are etched to form a trench in the integrated circuit substrate. The trench defines a first region on one side of the trench and a second region that is narrower than the first region on the other side of the trench. Plasma chemical vapor deposition is then performed to form an insulating layer filling the trench, on the first region and on the second region, with the insulating layer on the first region being thicker than on the second region. The insulating layer is then etched to expose the lift-off layer in the second region. The lift-off layer is then lifted off from the first region. Isolation trenches so formed can have improved isolation characteristics and can be planarized with reduced dishing effects.

In an embodiment of the present invention, when the insulating layer is etched, the insulating layer is removed from the second region, while at least some of the insulating layer remains on the first region. During the lift-off step, the remaining insulating layer on the first region is lifted off with the lift-off layer. In another embodiment, only a portion of the insulating layer is removed from the first region, and only a portion of the insulating layer is removed from the second region during the etching step. Then, during the lift-off step, the lift-off layer is removed from the first region and from the second region, to thereby remove the remaining insulating layer from on the first region and the second region.

According to other embodiments of the present invention, an intermediate layer is formed on the integrated circuit substrate and the lift-off layer is formed on the intermediate layer, opposite the integrated circuit substrate. The step of forming a trench then includes the step of etching the lift-off layer, the intermediate layer beneath the lift-off layer and the integrated circuit substrate beneath the intermediate layer to form a trench in the integrated circuit substrate.

After lifting off the lift-off layer, the insulating layer in the trench may be planarized by chemical-mechanical polishing. The planarizing step can be performed with reduced dishing, among other reasons because the remaining portions of the insulating layer have already been removed.

Preferably, the plasma chemical vapor deposition step concurrently deposits and etches the insulating layer, to thereby form an insulating layer on the first region that is thicker than on the second region. The plasma chemical vapor deposition preferably comprises one of high density plasma chemical vapor deposition and Electron Cyclotron Resonance (ECR) plasma chemical vapor deposition. Preferably, silicon dioxide deposited by plasma chemical vapor deposition, although other insulating layers may also be deposited. The lift-off layer preferably is selected from the group consisting of nitride, spin-on-glass, flowable oxide, tetraethyl orthosilicate (TEOS), titanium and titanium nitride.

It will also be understood by those having skill in the art that plasma chemical vapor deposition, etching and lift-off may be used to form an insulation-filled trench and an active region on one side of the trench. The plasma chemical vapor deposition step concurrently deposits and etches the insulating layer. After the lifting off step, the insulating layer in the trench may be chemical-mechanical polished with reduced dishing.

DETAILED DESCRIPTION OF PREFERRED EMBODIMENTS

Figure 1:
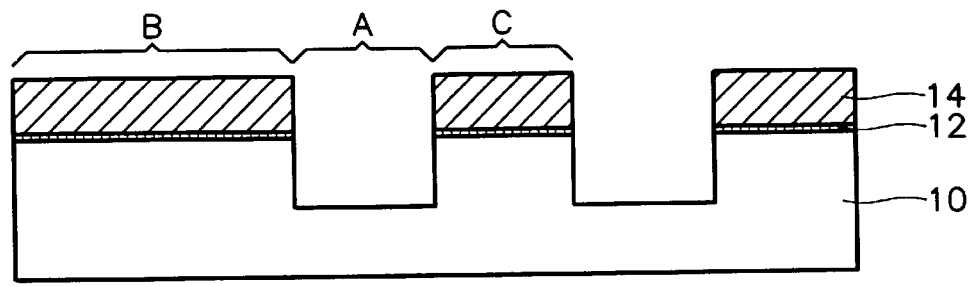
FIGS. 1–4 are cross-sectional views of a first embodiment of isolation methods for integrated circuits according to the present invention.

The present invention now will be described more fully hereinafter with reference to the accompanying drawings, in which preferred embodiments of the invention are shown.

This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer, region or substrate, it can be directly on the other layer, region or substrate, or intervening layers or regions may also be present.

FIGS. 1–4 are cross-sectional views of a first embodiment of isolation methods for integrated circuits according to the present invention. As shown in FIG. 1, a pad oxide film 12 and a lift-off layer 14 are formed on an integrated circuit substrate such as a semiconductor substrate 10. More specifically, a pad oxide film 12 is formed on a surface of a semiconductor substrate 10. A lift-off layer 14 is then formed on the pad oxide layer 12. The lift-off layer 14 is preferably selected from the group consisting of nitride, spin-on-glass (SOG), flowable oxide, tetraethyl orthosilicate (TEOS), titanium, titanium nitride and combinations thereof. More generically, the lift-off layer 14 comprises material that etches faster than an insulating layer that is formed thereon in subsequent steps.

Still referring to FIG. 1, the lift-layer 14 and the integrated circuit substrate beneath the lift-off layer are etched, for example using photolithography, to thereby form a trench A in the integrated circuit substrate, a first region B on one side of the trench and a second region C that is narrower than the first region, on the other side of the trench.

Figure 2:
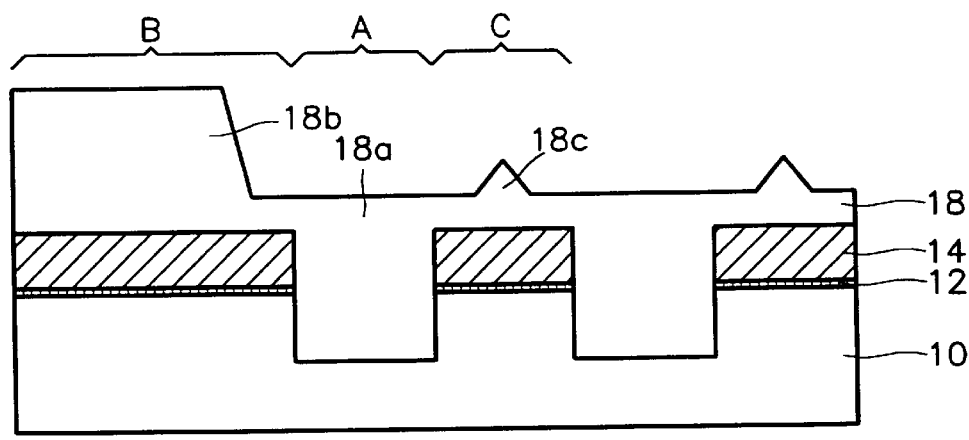

Referring now to FIG. 2, plasma chemical vapor deposition is used to form an insulating layer 18 on the integrated circuit. Insulating layer 18 fills the trench as shown at 18a. Insulating layer 18 is formed on the first region B as shown at 18b, and on the second region C as shown at 18c. As illustrated in FIG. 2, the insulating layer 18b on the first region B is thicker than insulating layer 18c on the second region C. Multiple materials may be deposited concurrently or in multiple sublayers.

Preferably, the plasma chemical vapor deposition step concurrently deposits and etches the insulating layer 18, to thereby form an insulating layer 18b on the first region B that is thicker than on the second region C. More specifically, the plasma chemical vapor deposition step may be a High Density Plasma (HDP) chemical vapor deposition step or an electron cyclotron resonance (ECR) plasma chemical vapor deposition step. In HDP or ECR plasma chemical vapor deposition, a negative voltage is generally applied to the substrate 10 and the plasma gas, such as argon gas, collides with the substrate 10 so that deposition and etching processes are concurrently performed, thereby filling the trench efficiently.

By using a plasma chemical vapor deposition step in which deposition and etching are concurrently performed, an insulating layer 18a can fill the trench region A. The insulating layer 18b on the wide first active region is relatively thick and the triangular insulating layer 18c on the narrow second region C is relatively thin.

Figure 3:
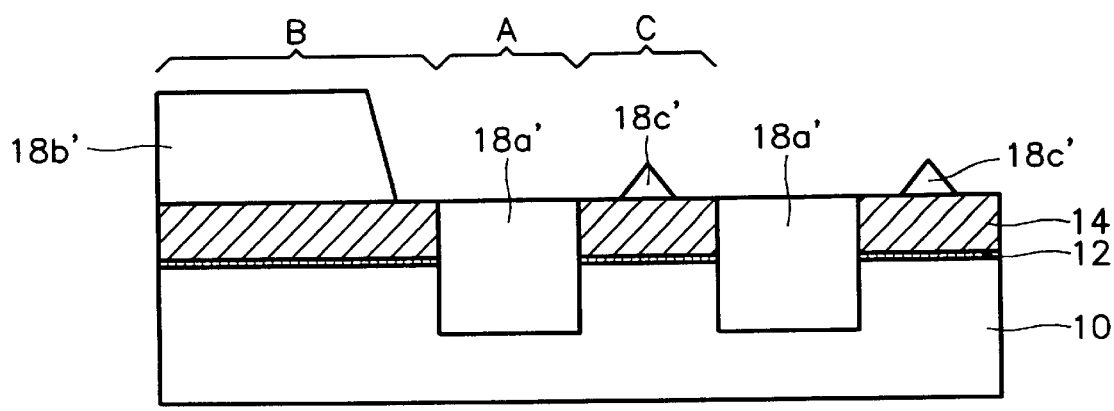

Referring now to FIG. 3, the insulating layer 18 is etched to expose the lift-off layer 14 in the second region C. In particular, the insulating layer 18 is etched until the lift-off layer 14 is exposed, so that insulating layer 18a′remains in the trench A, a relatively thick insulating layer 18b′remains on first region B, and a relatively thin triangular insulating region 18c′remains on second region C.

Figure 4:
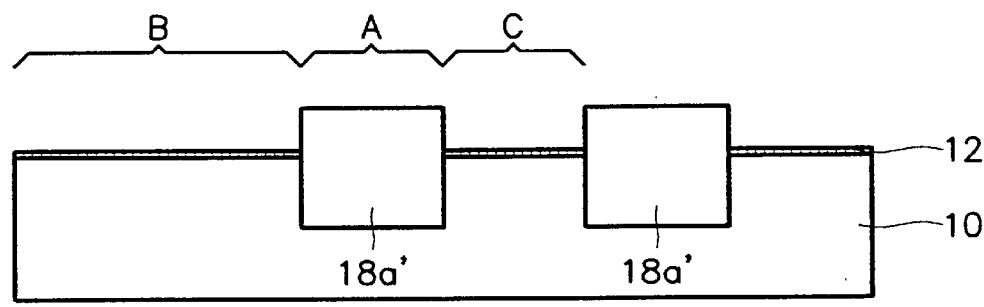

Finally, referring to FIG. 4, the lift-off layer 14 is removed form the first region B. It is also preferably removed from second region C, to thereby remove the remaining portions of the insulating layer from the first region B and from second region C. Since the lift-off layer 14 has a wet etch rate that is faster than that of the insulating layer 18, the exposed lift-off layer 14 is isotropically etched in a lift-off method, to thereby lift-off the insulating layer 18b′in the first region B, and to lift-off the insulating layer 18c′in second region C. Thus, insulating layer 18a′only remains in the trench in region A. Finally, chemical-mechanical polishing may be used to planarize the insulating material 18a′in the trench A.

Figure 5:
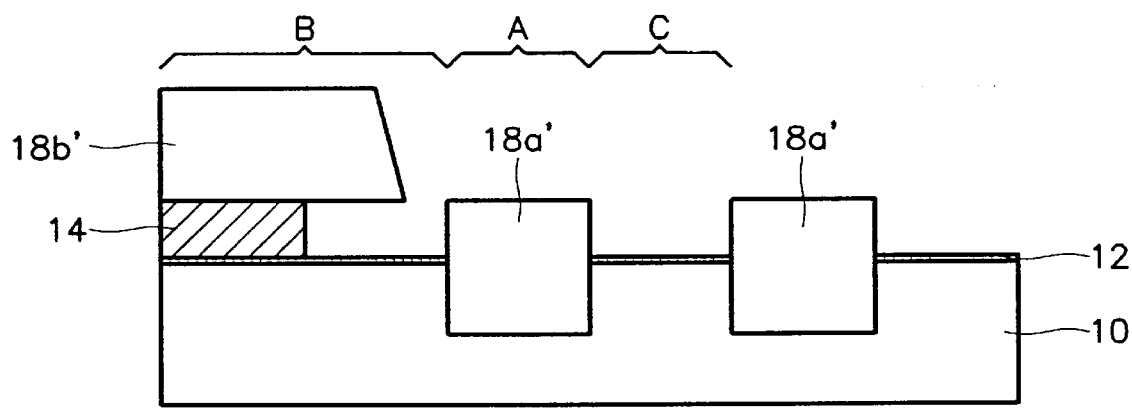
FIG. 5 is a cross-sectional view of a second embodiment of isolation methods for integrated circuits according to the present invention.

FIG. 5 illustrates a second embodiment of the present invention. In contrast with the first embodiment of FIGS. 1–4, the entire insulating layer 18c′is removed from the second region C prior to performing a lift-off of the layer 18b′from the first region B. More specifically, this embodiment proceeds as was already described in connection with FIGS. 1–3 above. Then, rather than performing the lift-off step of FIG. 4, the lift-off layer 14 is first partially etched to remove the insulating layer 18c from second region C. The lift-off layer 14 may also be removed from second region C and partially removed from first region B as shown. Then, a lift-off step is performed to remove the remaining insulating layer 18b′from region B, to thereby obtain the structure of FIG. 4.

Figure 6:
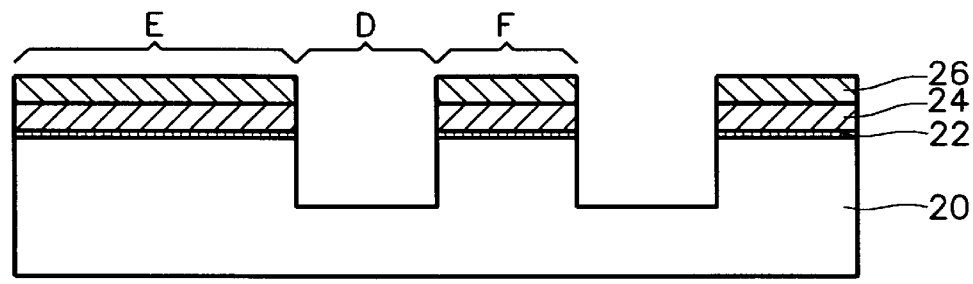
FIGS. 6–10 are cross-sectional views of a third embodiment of isolation methods for integrated circuits according to the present invention.

FIGS. 6–10 illustrate a third embodiment of isolation methods according to the present invention. In contrast with the embodiments of FIGS. 1–5, an intermediate layer is formed on the integrated circuit, and then a lift-off layer is formed on the intermediate layer, opposite the integrated circuit substrate. The lift-off layer, the intermediate layer beneath the lift-off layer, and the integrated circuit substrate beneath the intermediate layer are then etched to form the trench, the first region on one side of the trench and the second region on the other side of the trench. More specifically, as shown in FIG. 6, a pad oxide film 22, an intermediate layer 24 and a lift-off layer 26 are formed on an integrated circuit substrate 20. The lift-off layer 26, the intermediate layer 24 beneath the lift-off layer and the integrated circuit substrate 20 beneath the intermediate layer are etched to form a trench D in the integrated circuit substrate 20, a first region E on one side of the trench and second region F that is narrower than the first region E, on the other side of the trench D. It will be understood by those having skill in the art that the intermediate layer 24 may be a silicon nitride layer and that the lift-off layer 26 may be at least one material selected from the group consisting of SOG, flowable oxide, TEOS, titanium and titanium nitride.

Figure 7:
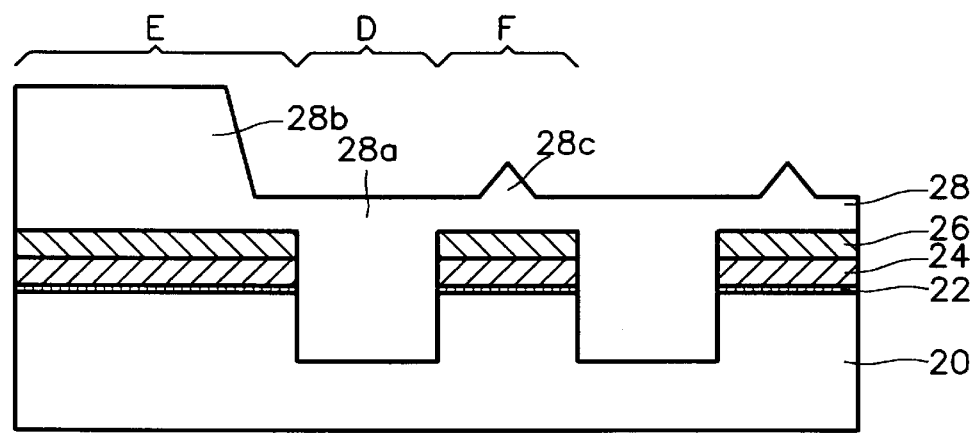

FIG. 7 illustrates the step of performing plasma chemical vapor deposition to form an insulating layer 28 including a portion 28a that fills the trench, a portion 28b on the first region E and a portion 28c on the second region F. As also shown in FIG. 7, the plasma chemical vapor deposition process causes the portion 28b on first region E to be thicker than the portion 28c on the second region F. Other details of the plasma chemical vapor deposition step were already described in connection with FIG. 2, and will not be described again herein.

Figure 8:
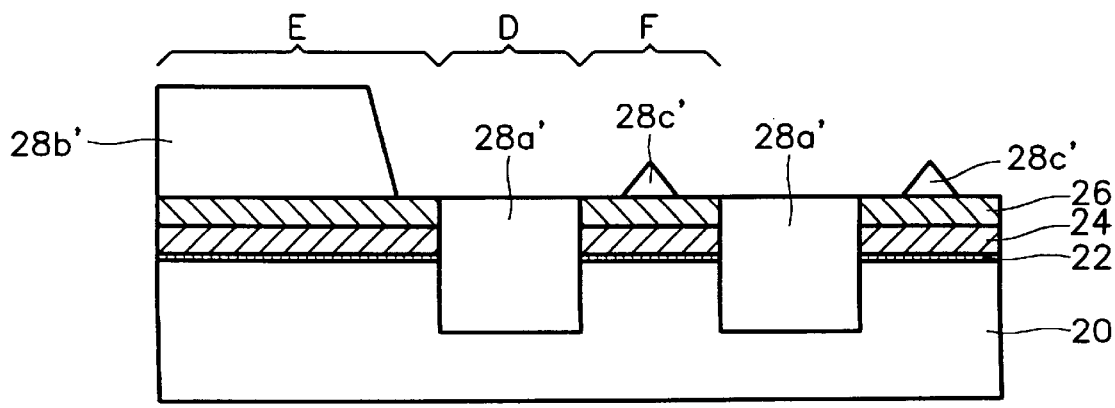
Figure 9:
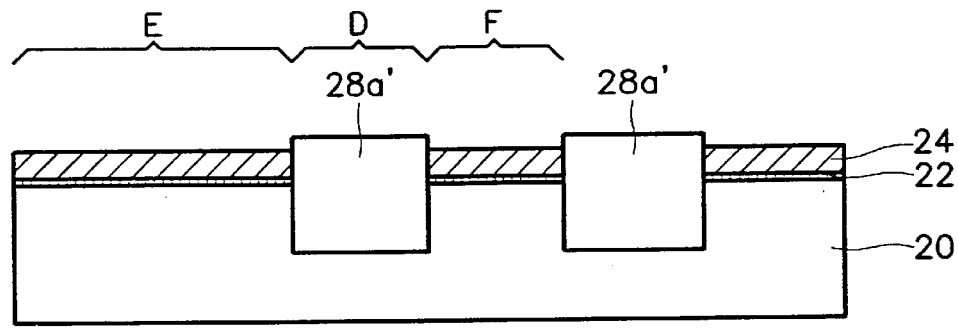
Figure 10:
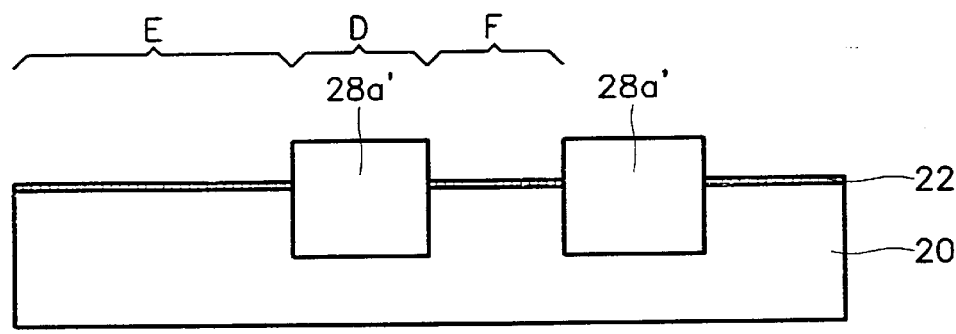

Then, referring to FIG. 8, the insulating layer 28 is etched until the lift-off layer 26 is exposed in the second region F, so that a portion 28b′of the insulating layer remains on first region E and a portion 28c′of the insulating layer 28 remains on the region F. Then, as shown in FIG. 9, a lift-off is performed to remove portions 28b′and 28c′so that portion 28a′remains in trench D. As was already described, chemical-mechanical polishing may then be performed to planarize portion 28a' in trench D. Finally, as shown in FIG. 10, the intermediate layer 24 may be removed.

Figure 11:
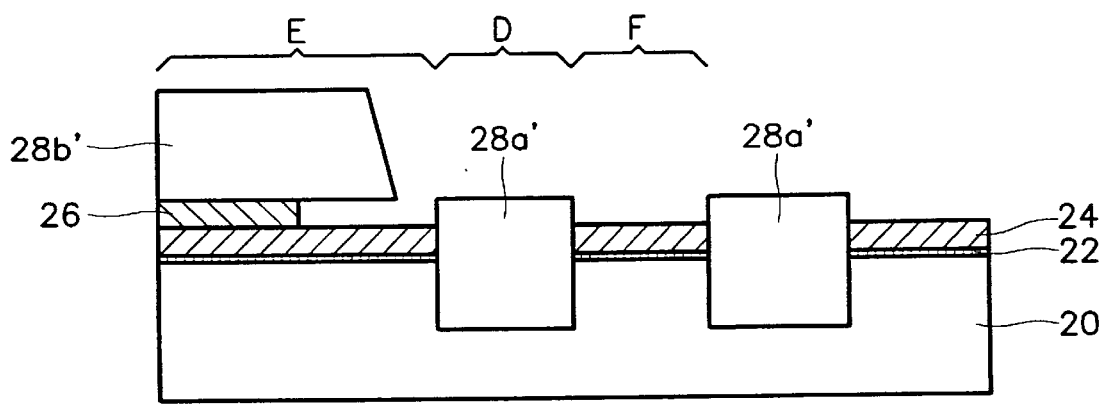
FIGS. 11 is a cross-sectional view of a fourth embodiment of isolation methods for integrated circuits according to the present invention.

Referring now to FIG. 11, a fourth embodiment of isolation methods according to the present invention will now be described. The fourth embodiment is the same as the third embodiment, except that the portion 28c' is completely removed from region F following the processing of FIG. 8. The lift-off layer 26 may also be completely removed from second region F and partially removed from first region E, to produce the structure of FIG. 11. A lift-off is then performed to produce the structure of FIG. 9. The intermediate layer 24 may then be removed to produce the structure of FIG. 10.

By using plasma chemical vapor deposition, in which deposition and etching are concurrently performed, an insulating layer can be efficiently filled in a trench to provide device isolation. Improved isolation can thereby be provided and planarization can also be improved in the isolation trench.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An isolation method for an integrated circuit comprising the steps of:

forming a lift-off layer on an integrated circuit substrate;

etching the lift-off layer and the integrated circuit substrate beneath the lift-off layer to form a trench in the integrated circuit substrate, a first region on one side of the trench, and a second region that is narrower than the first region, on the other side of the trench;

performing plasma chemical vapor deposition to form an insulating layer filling the trench, on the first region and on the second region, the insulating layer on the first region being thicker than on the second region;

etching the insulating layer to expose the lift-off layer in the second region; and lifting off the lift-off layer from the first region.

2. A method according to claim 1 wherein the etching step comprises the step of etching the insulating layer to remove the insulating layer from the second region.

3. A method according to claim 1:

wherein the step of etching the insulating layer comprises the step of etching the insulating layer to remove a portion of the insulating layer from the first region and to remove a portion of the insulating layer from the second region; and wherein the lifting off step comprises the step of lifting off the lift-off layer from the first region and from the second region.

4. A method according to claim 1 wherein the step of forming a lift-off layer on an integrated circuit substrate comprises the steps of:

forming an intermediate layer on the integrated circuit substrate; and forming a lift-off layer on the intermediate layer, opposite the integrated circuit substrate; and wherein the step of etching the lift-off layer comprises the step of etching the lift-off layer, the intermediate layer beneath the lift-off layer and the integrated circuit substrate beneath the intermediate layer to form a trench in the integrated circuit substrate, a first region on one side of the trench, and a second region that is narrower than the first region, on the other side of the trench.

5. A method according to claim 4 wherein the etching step comprises the step of etching the insulating layer to remove the insulating layer from the second region.

6. A method according to claim 4:

wherein the step of etching the insulating layer comprises the step of etching the insulating layer to remove a portion of the insulating layer from the first region and to remove a portion of the insulating layer from the second region; and wherein the lifting off step comprises the step of lifting off the lift-off layer from the first region and from the second region.

7. A method according to claim 1 wherein the plasma chemical vapor deposition step concurrently deposits and etches the insulating layer to thereby form an insulating layer on the first region that is thicker than on the second region.

8. A method according to claim 1 wherein the lift-off layer is at least one material selected from the group consisting of nitride, spin-on-glass, flowable oxide, tetraethyl orthosilicate, titanium and titanium nitride.

9. A method according to claim 1 wherein the lifting off step is followed by the step of chemical-mechanical polishing the insulating layer in the trench.

10. A method according to claim 1 wherein the step of performing plasma chemical vapor deposition comprises the step of performing one of high density plasma chemical vapor deposition and electron cyclotron resonance plasma chemical vapor deposition.

11. An isolation method for an integrated circuit comprising the steps of:

forming a lift-off layer on an integrated circuit substrate;

etching the lift-off layer and the integrated circuit substrate beneath the lift-off layer to form a trench in the integrated circuit substrate and an active region on one side of the trench;

performing plasma chemical vapor deposition to form an insulating layer filling the trench and on the active region;

etching the insulating layer to expose the lift-off layer in the active region; and lifting off the lift-off layer from the active region.

12. A method according to claim 11 wherein the step of forming a lift-off layer on an integrated circuit substrate comprises the steps of.

forming an intermediate layer on the integrated circuit substrate; and forming a lift-off layer on the intermediate layer, opposite the integrated circuit substrate; and wherein the step of etching the lift-off layer comprises the step of etching the lift-off layer, the intermediate layer beneath the lift-off layer and the integrated circuit substrate beneath the intermediate layer to form a trench in the integrated circuit substrate and an active region on one side of the trench.

13. A method according to claim 1 wherein the plasma chemical vapor deposition step concurrently deposits and etches the insulating layer.

14. A method according to claim 11 wherein the lift-off layer is at least one material selected from the group consisting of nitride, spin-on-glass, flowable oxide, tetraethyl orthosilicate, titanium and titanium nitride.

15. A method according to claim 1 wherein the lifting off step is followed by the step of chemical-mechanical polishing the insulating layer in the trench.

16. A method according to claim 1 wherein the step of performing plasma chemical vapor deposition comprises the step of performing one of high density plasma chemical vapor deposition and electron cyclotron resonance plasma chemical vapor deposition.

* * * * *

UNITED STATES PATENT AND TRADEMARK OFFICE
CERTIFICATE OF CORRECTION

PATENT NO. : 6,001,696
DATED : December 14, 1999
INVENTOR(S) : Kim et al.

It is certified that error appears in the above-identified patent and that said Letters Patent is hereby corrected as shown below:

Column 7, line 1, please delete "1" and substitute -- 11 -- therefor.
Column 7, line 4, please delete "1" and substitute -- 11 -- therefor.

Signed and Sealed this

Fifth Day of September, 2000

Attest:

Q. TODD DICKINSON

*Attesting Officer*  *Director of Patents and Trademarks*